(12) United States Patent
Korec et al.

(10) Patent No.: US 7,745,846 B2
(45) Date of Patent: Jun. 29, 2010

(54) LDMOS INTEGRATED SCHOTTKY DIODE

(75) Inventors: Jacek Korec, Sunrise, FL (US);
Shuming Xu, Schnecksville, PA (US);
Christopher Boguslaw Kocon,
Mountain Top, PA (US)

(73) Assignee: Ciclon Semiconductor Device Corp.,
Bethlehem, PA (US)

( * ) Notice: Subject to any disclaimer, the term of this patent is extended or adjusted under 35 U.S.C. 154(b) by 98 days.

(21) Appl. No.: 12/014,581

(22) Filed: Jan. 15, 2008

(65) Prior Publication Data

US 2009/0179264 A1  Jul. 16, 2009

(51) Int. Cl.
*H01L 31/111* (2006.01)
*H01L 21/28* (2006.01)

(52) U.S. Cl. .................... 257/155; 438/571

(58) Field of Classification Search ........ 257/E27.016, 257/E27.338, 357, 475, 152–156, E33.051–E33.075; 438/571, 581
See application file for complete search history.

(56) References Cited

U.S. PATENT DOCUMENTS

| | | | |
|---|---|---|---|
| 4,001,860 A | 1/1977 | Cauge et al. | |
| 4,455,565 A | 6/1984 | Goodman et al. | |
| 4,754,310 A | 6/1988 | Coe | |
| 4,811,065 A * | 3/1989 | Cogan | ........... 257/328 |
| 5,155,563 A | 10/1992 | Davies et al. | |
| 5,216,275 A | 6/1993 | Chen | |
| 5,252,848 A | 10/1993 | Adler et al. | |
| 5,365,102 A | 11/1994 | Mehrotra et al. | |
| 5,841,166 A | 11/1998 | D'Anna et al. | |
| 5,907,173 A | 5/1999 | Kwon et al. | |
| 5,912,490 A | 6/1999 | Hebert et al. | |
| 5,949,104 A | 9/1999 | D'Anna et al. | |
| 6,001,710 A | 12/1999 | Francois et al. | |
| 6,063,678 A | 5/2000 | D'Anna | |
| 6,078,090 A * | 6/2000 | Williams et al. | ............ 257/476 |
| 6,181,200 B1 | 1/2001 | Titizian | |
| 6,215,152 B1 | 4/2001 | Hebert | |
| 6,372,557 B1 | 4/2002 | Leong | |
| 6,521,923 B1 | 2/2003 | D'Anna | |
| 6,600,182 B2 | 7/2003 | Rumennik | |
| 6,653,740 B2 | 11/2003 | Kinzer et al. | |
| 6,677,641 B2 | 1/2004 | Kocon | |
| 6,720,618 B2 * | 4/2004 | Kawaguchi et al. | ......... 257/341 |
| 6,831,332 B2 | 12/2004 | D'Anna et al. | |
| 6,956,239 B2 | 10/2005 | Sriram | |

(Continued)

*Primary Examiner*—Calvin Lee
(74) *Attorney, Agent, or Firm*—William B. Kempler; Wade J. Brady, III; Frederick J. Telecky, Jr.

(57) ABSTRACT

A semiconductor device includes a substrate having a first conductivity type and a semiconductor layer formed over the substrate and having lower and upper surfaces. A laterally diffused metal-oxide-semiconductor (LDMOS) transistor device is formed over the substrate and includes a source region of the first conductivity type and a drain extension region of the first conductivity type formed in the semiconductor layer proximate the upper surface of the semiconductor layer, and a drain contact electrically connecting the drain extension region to the substrate. A Schottky diode is formed over the substrate and includes at least one doped region of the first conductivity type formed in the semiconductor layer proximate to the upper surface, an anode contact forming a Schottky barrier with the at least one doped region, and a cathode contact laterally spaced from the anode contact and electrically connecting at least one doped region to the substrate.

23 Claims, 8 Drawing Sheets

U.S. PATENT DOCUMENTS

| | | |
|---|---|---|
| 7,126,193 B2 | 10/2006 | Baiocchi et al. |
| 7,166,496 B1 | 1/2007 | Lopez et al. |
| 7,235,845 B2 | 6/2007 | Xu et al. |
| 7,282,765 B2 * | 10/2007 | Xu et al. .................... 257/343 |
| 2004/0021233 A1 | 2/2004 | Kinzer et al. |
| 2005/0017298 A1 | 1/2005 | Xie et al. |
| 2008/0081440 A1 * | 4/2008 | Parsey et al. ............... 438/477 |

* cited by examiner

US 7,745,846 B2

LDMOS INTEGRATED SCHOTTKY DIODE

FIELD OF THE INVENTION

The present invention relates to semiconductor devices, and more specifically to Schottky diodes.

BACKGROUND OF THE INVENTION

Schottky diodes are employed as rectifiers in numerous power and small signal applications where the forward conduction or switching characteristics of the diode are important. These diodes are used extensively as output rectifiers in switching-mode power supplies and in other high-speed power switching applications such as motor drives for carrying large forward currents. Ultra-low forward voltage drop ($V_F$) under conduction and good blocking performance under a reverse bias are the desirable characteristics of an efficient Schottky diode.

One advanced design for a MOSFET to be used as a synchronous rectifier integrates a Schottky contact in each active cell of the transistor device. The Schottky contact clamps the internal body diode of the MOSFET to a voltage below 0.7V during conduction. The injection of minority carriers by the body diode is strongly suppressed, and the reverse recovery of the body diode is minimized.

Trench-MOS Barrier Schottky (TMBS) diodes are described in, for example, U.S. Pat. No. 5,365,102 to Mehrotra et al. and U.S. Pat. No. 6,078,090 to Williams et al., the entirety of each of which is hereby incorporated by reference herein. The Schottky diodes of these references shield the Schottky contact interface against a high electric field under reverse bias conditions, and by doing so allow an increase in the doping of the semiconductor material in the vicinity of the Schottky contact, which lowers the $V_F$ under conduction. Williams et al. discloses a trench-gated Schottky diode integrated with an internal clamping diode in the form of a trench MOSFET.

A Schottky diode is desired that can be monolithically integrated with other types of MOSFET devices.

SUMMARY OF THE INVENTION

A semiconductor device includes a substrate having a first conductivity type and a semiconductor layer formed over the substrate and having lower and upper surfaces. A laterally diffused metal-oxide-semiconductor (LDMOS) transistor device is formed over the substrate and includes a source region of the first conductivity type and a drain extension region of the first conductivity type formed in the semiconductor layer proximate the upper surface of the semiconductor layer, and a drain contact electrically connecting the drain extension region to the substrate. A Schottky diode is formed over the substrate and includes at least one doped region of the first conductivity type formed in the semiconductor layer proximate to the upper surface, an anode contact forming a Schottky barrier with the at least one doped region, and a cathode contact laterally spaced from the anode contact and electrically connecting at least one doped region to the substrate.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

As used herein, the following dopant concentrations are distinguished using the following notations:

(a) N++ or P++: dopant concentration $>5\times10^{19}$ atoms/cm$^3$;

(b) N+ or P+: dopant concentration of $1\times10^{18}$ to $5\times10^{19}$ atoms/cm$^3$;

(c) N or P: dopant concentration of $5\times10^{16}$ to $1\times10^{18}$ atoms/cm$^3$;

(d) N− or P−: dopant concentration of $1\times10^{15}$ to $5\times10^{16}$ atoms/cm$^3$; and (e) N−− or P−−: dopant concentration $<1\times10^{15}$ atoms/cm$^3$.

Various exemplary laterally diffused MOS transistors (LDMOS) structures are disclosed in the following commonly assigned, copending patent applications, the entirety of each of which is hereby incorporated by reference herein: U.S. patent application Ser. No. 11/180,155, published as U.S. Published Application No. 2007-001308A1 (the '155 patent Application); U.S. patent application Ser. No. 11/202,968, published as U.S. Published Application No. 2007/0034944A1; and U.S. patent application Ser. No. 11/676,613, which was filed on Feb. 20, 2007 (the '613 patent Application).

Figure 1A:
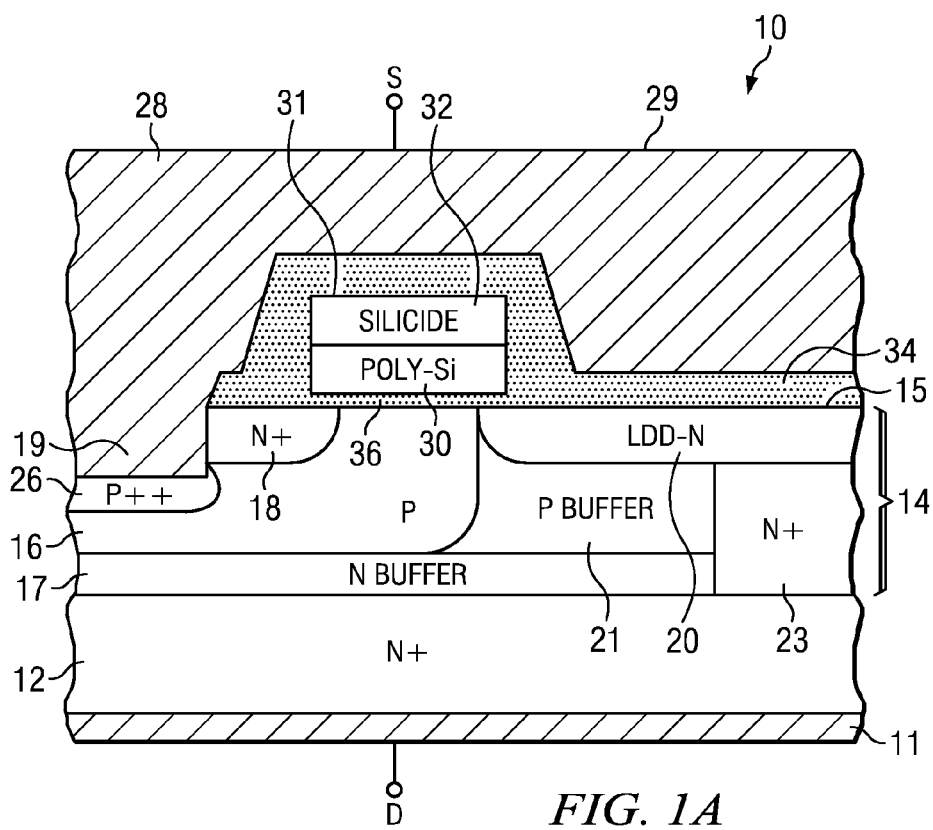
FIG. 1A is a cross-sectional view of a first embodiment of an exemplary LDMOS transistor which may be integrated with a Schottky diode.

FIG. 1A is a cross-sectional view of a low voltage power LDMOS transistor device 10 shown and described in the '613 patent Application. As explained in the '613 patent Application, the transistor structure 10 includes an N+ doped semiconductor substrate 12, although in alternative embodiments the substrate 12 may be P+ doped. In embodiments, a metal drain electrode 11 is formed along the bottom of the substrate 12 and is electrically connected to the N+substrate 12. A semiconductor layer is formed over substrate 12. In embodiments, the semiconductor layer is a lightly doped silicon epitaxial layer 14 formed over the upper surface of substrate 12. The epitaxial layer 14 has an upper surface designated by the reference number 15. The epitaxial layer 14 is lightly doped at fabrication for reasons not pertinent to this disclosure and then doped to form the illustrated doping profile as described in more detail below. In one embodiment, the epitaxial layer 14 has a thickness between about 1.5 to 4.0 μm. The epitaxial layer thickness is referred to as the metallurgical thickness of the grown layer.

The original doping of the epitaxial layer has no effect on the resistance of the device because the current flows through the vertical drain contact region 23 (described below). In one embodiment, the initial doping concentration in the epitaxial layer 14 can be kept very low, below $2 \times 10^{16}$ atoms/cm$^3$, and more preferably at or below $8 \times 10^{15}$ atoms/cm$^3$, for example.

A conductive gate stack 31 comprising, for example, a polysilicon layer or region 30 and a silicide layer or region 32 overlies a gate dielectric layer 36 formed over the upper surface 15 of the epitaxial layer 14.

Drain implant region 20 is formed completely within epitaxial layer 14 and forms an enhanced drain drift region (labeled LDD-N). This region is also referred to herein as a drain extension region. The drain extension region 20 is formed abutting or at least proximate to the upper surface 15 of layer 14 and has a dopant concentration N in the illustrated embodiment, which is less than the dopant concentration (N+) of the highly-doped source region 18. As those skilled in the art will recognize, this drain extension region 20 increases the drain-to-source breakdown voltage of the LDMOS structure 10. The LDD extension region 20 has a lateral dimension between about 0.3 to 1.5 μm, and a depth of between about 0.2 to 0.4 μm, although these dimensions vary based on the desired breakdown voltage rating of the device. The region 20 preferably extends below (i.e., is overlapped by) the conductive gate 31 between about 0.05 to 0.15 μm.

The LDMOS structure 10 also includes a source implant region 18 having a conductivity N+ spaced from the enhanced drain drift region 20. Source region 18 extends laterally between about 0.3 to 0.8 μm, has a depth between about 0.15 to 0.3 μm and also partially underlies the conductive gate 31 between about 0.05 to 0.15 μm. The slight overlapping of the source and drain regions 18, 20 by the gate 31 provides continuous conduction in the channel region of the device.

A body region 16 having P-type dopants and having a conductivity of P concentration is formed in epitaxial layer 14 and has a subregion between the source 18 and enhanced drain region 20, forming the channel region therebetween. The body region 16 includes body contact region 26. In exemplary embodiments, the body region 16 is formed to a depth of between about 0.5 to 1.0 μm and horizontal length between about 0.8 to 1.5 μm.

The body contact region 26 has a high dopant implant concentration, such as P++, which is greater than the dopant concentration of the body region 16. The body contact region 26 is formed at the base of a shallow trench region (designated by reference 19) formed in epitaxial layer 14 and has a half width lateral dimension between about 0.1 to 0.3 μm (meaning the width attributed to one cell of a pair of adjacent transistor cells sharing the same source contact) and a depth between about 0.1 to 0.3 μm. The body contact region 26 provides a low resistance contact between the source metal layer 28 and the body region 16.

The transistor device 10 also includes an insulating layer 34 that insulates the gate 31 form the source metal layer 28 and the enhanced drain drift region 20 from the source metal layer 28.

The device 10 includes highly conductive region 23 formed in the epitaxial layer 14 that electrically connects the drain extension region 20 to the conductive substrate 12. In one preferred embodiment of the device of FIG. 11, the conductive region 23 is an N+ doped implant region formed between the substrate 12 and the drain extension region 20. This doped region 23 is laterally and vertically spaced from the gate 31. In some embodiments, a topmost portion of the doped region 23 is also vertically spaced from (i.e., recessed from) the upper surface 15 of the epitaxial layer 14. In embodiments, doped region 23 is spaced from the upper surface 15 of the epitaxial layer 14 by at least a part of the drain extension region 20. In some embodiments, the highly-doped implant region 23 can extend partially into the drain extension region 20 though in preferred embodiments it is substantially limited to the area defined between the drain extension region 20 and the substrate 12 as long as electrical contact is made to the drain extension region 20. Doped drain contact region 23 provides a low resistance path between the drain extension region 20 and substrate 12, and thus to the drain electrode 11. In the n-channel embodiment shown in FIG. 1A, the drain contact 23 has a dopant concentration of N+ or higher. In one embodiment, drain contact 23 has a horizontal width in epitaxial layer 14 in the amount of about 0.2 to 0.04 μm (half width). In a case of an n-channel MOSFET designed for Vds,max of 20V, the drain plug region 23 can be formed by two consecutive implantations of phosphorous. In this embodiment, the first implantation has a dose of about 8e12 cm$^{-2}$ at 200 keV and the second implant has a dose of about 8e12 cm$^2$ at 800 keV. These implantations can be masked by a double layer of an oxide with a thickness of about 1.5 μm covered by a photoresist with a thickness of about 1.3 μm formed over upper surface 15 of the epitaxial layer 14.

The doped drain contact region 23 creates a region of high conductivity which is inserted between the drain extension region 20 and the doping profile created by the substrate 12 of the epitaxial layer 14. The preferred doping concentration in this region is at least $1 \times 10^{18}$ atoms/cm$^3$.

The epitaxial layer 14 of the LDMOS device 10 can be doped to include a thin N-doped buffer layer 17 (labeled N buffer) formed directly over the substrate 12. In some embodiments, the doping concentration of the buffer layer 17 is comparable to or slightly higher than that of body region 16, i.e., N doping concentration. This buffer region 17 is used to clamp the breakdown voltage of the transistor underneath of the source contact region, i.e., underneath implant region 26, thus suppressing any impact of the variation in the epitaxial layer thickness on the performance of the device.

A P-doped buffer layer 21 is formed over the N-doped buffer 17, below the LDD extension region 20, and laterally between the p-body 16 and N+ doped drain contact region 23. The buffer layer 21 is separately doped from the body region 16 and the sheet charge in this layer (concentration times thickness) is comparable to the sheet charge within the LDD layer 20, thus complying with the charge coupling guidelines discussed below.

N-doped buffer region 17 has a dopant concentration N and P-doped buffer region 21 has a dopant concentration P. The deep implantation of N dopants (preferably Phosphorous) to form the buffer layer 17 can be performed at the beginning of the process flow after the deposition of the epitaxial layer 14. Buffer layer 21 can be formed after implantation of layer 17 or after the formation of drain plug 23.

The source metal layer or electrode 28 of the device 10 preferably comprises conductive material selected from the group consisting of Al, Ti/Al, Ti/TiN/Al or W blanket deposited over the device such as by CVD (chemical vapor deposition) or by sputtering. The metal layer 28 may comprise multiple layers of metal or metal alloys. In embodiments, the source electrode 28 may be wire bonded or soldered directly to the external package electrode. The source electrode 28 is deposited to fill shallow trench 19 to provide the electrical contact with the source implant 18 as well as to provide a short between the source 18 and body region 16. Source electrode 28 extends over insulation layer 34 and covers the entire surface area of the wafer, including the gate structure 31 and drain extension region 20 (except for a small area set aside for the gate contact). In one embodiment, the source metal layer 28 has a thickness defined between the upper surface 15 of the epitaxial layer 14 and its upper surface 29 between about 1.0 to 5.0 µm.

As explained in the '613 patent Application, current flows from the source contact through the channel underneath of the gate 31 into the lightly doped drain extension (LDD) 20 and finally through the implanted drain contact 23 into the highly doped substrate 12. The source contact has been etched through the source implant region 18 in order to provide a low resistive connection to the P-body region 16. The N-buffer layer 17 is implanted just in front of the doping gradient from the substrate 12 in order to make the transistor performance insensitive to the variation in the doping of the substrate 12 and to the variation of the thickness in the epitaxial layer 14, which is used as a starting material. The implanted N-buffer layer 17 in combination with the P+ contact 26 to the body region 16 pins the breakdown voltage of the device 10 to the location underneath of the source contact. This assures a high avalanche ruggedness of the transistor 10 and improves its reliability by keeping the hot carriers away from the gate oxide. The breakdown voltage of the active cell is designed by the proper choice of the doping of the P-buffer region 21 and the thickness of the field oxide 34 separating the LDD region 20 from the source electrode 28. This technique is called charge coupling. Using the charge coupling technique allows the doping of the LDD region 30 to a higher doping level and the maintenance of the breakdown voltage at a desired level.

Figure 1B:
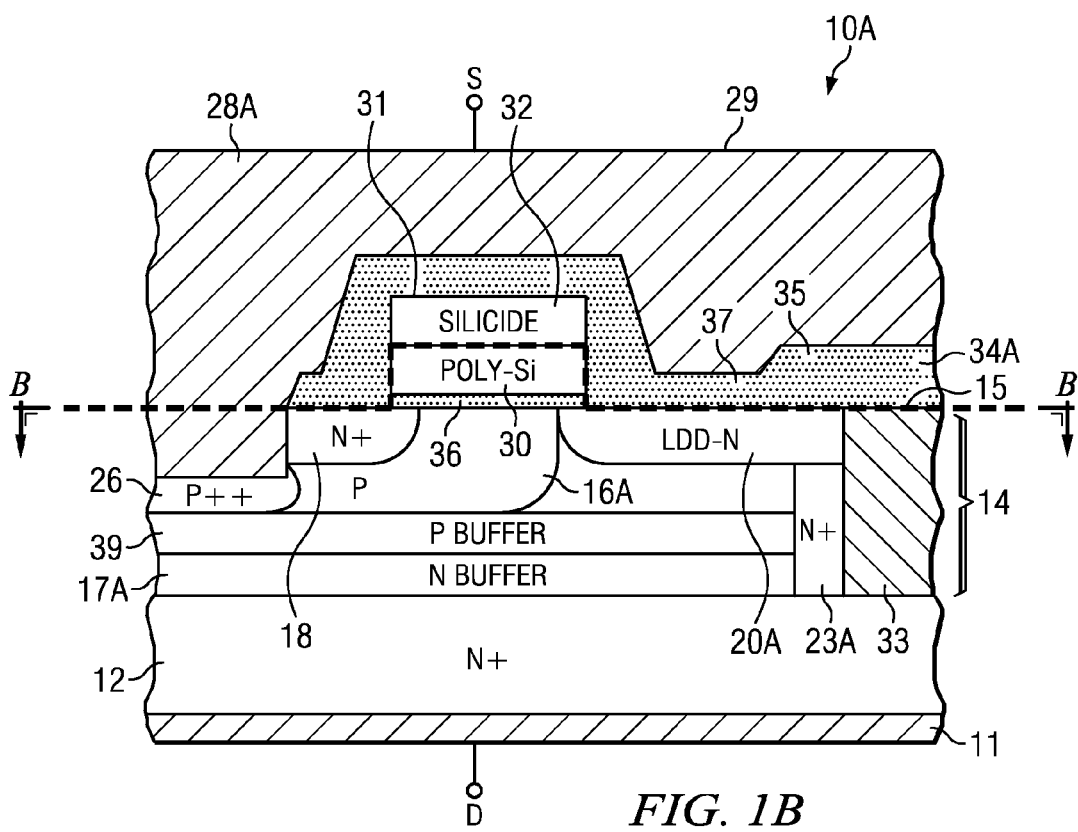
FIG. 1B is a cross-sectional view of a second embodiment of an exemplary LDMOS transistor which may be integrated with a Schottky diode.

By way of a second non-limiting example of a LDMOS device, FIG. 1B is a cross-sectional view of a low voltage power LDMOS transistor device 10A shown and described in full in the '155 patent Application. Like reference numbers are used in FIG. 1B as in FIG. 1A to describe like features. Some differences between the structure of FIG. 1A and that of FIG. 1B are described briefly below.

The primary difference between the structure of FIG. 1B and that of FIG. 1A is that conductive implant region 23A is formed along the sidewall of a trench formed from the upper surface 15 of the epitaxial layer 14 to the upper surface of the substrate 12. In embodiments, the implant plug 23A, which couples the drain extension region 20A to the substrate 12, is formed by an angled implantation. The trench is then filled with either a conductive material, such as doped polysilicon, or an insulator (collectively shown as plug 33).

The transistor 10A also includes a double buffer layer including N buffer layer 17A and P buffer layer 39 formed between the P body region 16A and the upper surface of the substrate 12. In this double deep implant buffer construction, the breakdown location is advantageously located at or around the P-N junction between buffer layer 17A and buffer layer 39, making the breakdown location largely independent of the thickness of the epitaxial layer 14 and the dopant concentration of the substrate 12. The deep implantation of N dopants (preferably Phosphorous) to form the second buffer layer 17A is performed at the beginning of the process flow, after the deposition of the epitaxial layer 14.

Further, in some embodiments, the insulation layer 34A has two thicknesses in the region proximate to the drain implant region 20A and doped drain contact 23A and trench plug 33. More specifically, insulation layer 34A has a thicker region designated generally by numeral 35 formed over the doped contact 23A and drain plug 33 and parts of drain region 20A and a thinner portion 37 formed over drain region 20A and between the thicker portion 35 and the gate 31. The source metal layer 28A provides a contact to the source and body regions and a shield between the gate and the drain contact, and also provides for better optimization of the field plate effect. Limiting the location of the thin oxide region 37 makes the field plate effect very effective at the gate corner by pushing the depletion layer away from the PN-junction between the body region 16A and the drain 20A. If the thin oxide were to extend laterally to cover all of the drain region 20A and the drain plug 33, a high electric field peak would be located at the N-N+ drain contact corner. Making the oxide thicker at 35 relieves the electric field between the source metal and the drain contact region 23A.

FIGS. 2A and 2B and FIGS. 3A and 3B show various embodiments of Schottky diodes that can be monolithically integrated with the LDMOS transistor structures, such as those described above in connection with FIGS. 1A and 1B and other embodiments of transistors described in the copending applications listed above. The structures shown in FIGS. 2A and 2B can be formed integrally with the LDMOS transistors using the same fabrication steps used to form these LDMOS transistors with only minor modifications, as will be described herein.

Figure 2A:
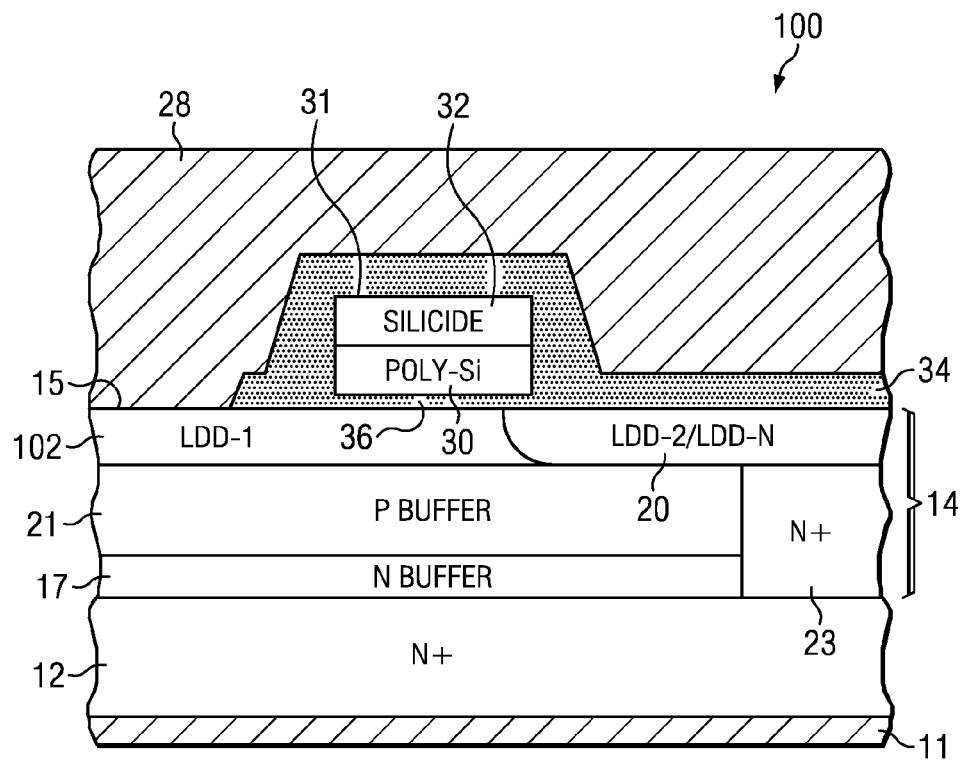
FIGS. 2A and 2B are cross-sectional views of a first embodiment of a Schottky diode for integration with the LDMOS transistors of FIGS. 1A and 1B, respectively.

As shown in FIG. 2A, the transistor structure 10 of FIG. 1A can be simplified to accommodate a Schottky contact and form a Schottky diode 100 that is monolithically integrated with the LDMOS transistor 10. Features shared in common by the Schottky diode 100 and the LDMOS transistor 10 are identified by the same reference numbers, i.e., electrode 11, substrate 12, epitaxial layer 14, N buffer 17, P buffer 21, poly gate 31, insulation layer 34, implant plug 23 and source electrode 28. Source electrode 28 serves as both source electrode for the LDMOS transistor 10 and, in the diode region, as the metal anode and Schottky contact for the Schottky diode 100. This convention, i.e., keeping the same reference numerals, is adopted for purposes of illustrating that the Schottky diode 100 can advantageously be integrated with LDMOS transistors 10 and that the devices can be formed as part of the same process. Nonetheless, it is also envisioned that the Schottky diode 100 as shown in FIG. 2A can form a stand alone device or be integrated with devices other than the LDMOS devices described herein.

When compared with the LDMOS device 10, the source implant, source contact and P-body regions of the structure 10 are eliminated in the Schottky diode 100. The anode metal electrode 28 forms a rectifying Schottky/anode contact to a first lightly doped region 102 labeled LDD-1 formed in epitaxial layer 14 proximate to the upper surface 15 thereof, thus providing a Schottky barrier with the region 102. This region 102 has an N-type doping with a dopant concentration less than $1 \times 10^{17}$ atoms/cm$^3$, and preferably between about $2 \times 10^{16}$ to $8 \times 10^{15}$ atoms/cm$^3$ for low voltage diodes. The LDD-1 region 102 can be formed before deposition of the gate 31 as a blanket implant or after the poly gate deposition with an appropriate mask limiting the implant to the appropriate implant window. In one preferred embodiment, the metal electrode 28 is deposited as a metal stack of Ti/TiN/Al, where the Ti layer is located at the interface with the upper surface 15 of the silicon epitaxial layer 14 to form a titanium silicide (TiSi$_x$) after an anneal at a temperature between about 630°-680° C. Titanium silicide forms a stable Schottky barrier with silicon with a barrier height between about 0.55-0.58 eV. The same metallization system creates a low resistive ohmic contact to N and P type regions when the silicon doping is higher than $2\times10^{19}$ atoms/cm$^3$, such as at highly doped body contact implant region 26 formed at the bottom of trench 19 of the LDMOS transistors 10, 10A. Other metal systems, preferably with a silicide phase at the silicon interface, can be used for the same purpose.

The Schottky diode 100 includes a second doped region adjacent to LDD-1 region 102 labeled LDD-2/LDD-N 20. LDD-2 corresponds to the LDD-N region shown in FIG. 1A, i.e., is part of the same implant region. The LDD-2 region is formed by implantation after the gate deposition and patterning. In the same manner as with the transistor 10 of FIG. 1A, the LDD-2 region 20 creates a charge coupled structure in combination with the P-buffer 21 and the anode electrode 28 formed over the field oxide 34. The field oxide has a specified thickness, usually between about 0.1 and 0.2 µm. The charge coupled design allows for the design of the desired breakdown voltage, i.e., of more than 30 V, when using a relatively high doping concentration in the LDD-2 region 20, for example of more than $1\times10^{17}$ atoms/cm$^3$.

In a preferred embodiment of the device, when integrated with LDMOS transistors having vertical current flow such as described above, the current flowing horizontally through the LDD regions 102, 20 is diverted towards the substrate 12 by the highly doped implant 23. The region has a high conductivity and can be formed, for example, by the multiple implantation technique described above.

The Schottky diode shown in FIG. 2A is sometimes referred to herein as a Lateral-Gated Schottky diode (LG-Schottky). The diode 100 can be easily integrated with the LDMOS transistor structure 10 of FIG. 1A by an alternative combination of active cells of LDMOS transistors of FIG. 1A and those of FIG. 2A, preferably in the third dimension as best described in connection with FIGS. 1A, 2A and 4A. The area of the Schottky contact will occupy only a few percent (e.g., ≦10%) of the total active area of the integrated device. The breakdown voltage of the integrated device is determined by the PN junction underneath the source contact of the LDMOS transistor 10. It is lower than the breakdown voltage of the active cell of the Schottky diode 10 by about 2 to 3V. This PN diode comes first into the avalanche mode when the integrated device is biased above the breakdown voltage. In the same way as with a LDMOS transistor 10 alone, the integrated device exhibits good avalanche ruggedness with high reliability. The triggering of a bipolar transistor action during avalanche breakdown in the LDMOS part of the device is suppressed. The bipolar action may be triggered by the voltage drop across the body region if the minority carries are generated by impact ionization at the gate and have to flow to the source contact as induced by the avalanche current. The voltage drop across the body region is avoided by the integration of a short current path between the source contact and the substrate just underneath it. The minority carrier generation also takes place underneath the source contact and there is no avalanche current generated at the gate. The elimination of the generation of hot carriers at the vicinity of the gate also improves the reliability of the gate oxide considerably.

Figure 2B:
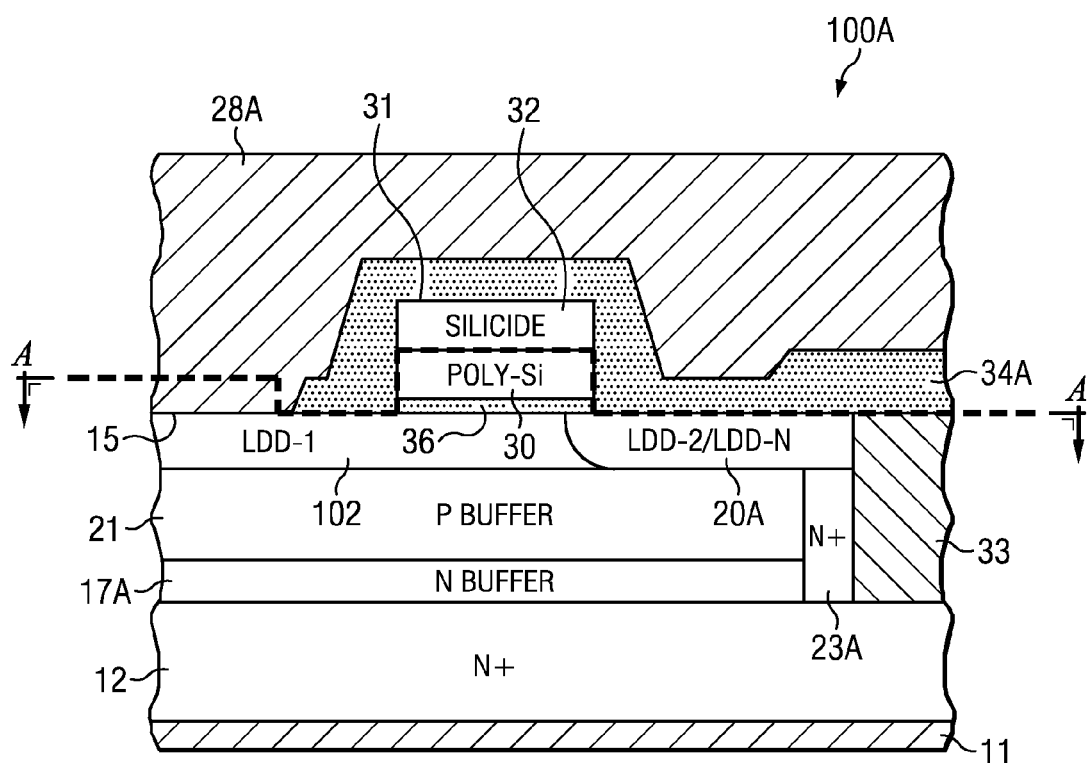

FIG. 2B shows an embodiment of a Schottky diode 100A that may be integrated with, for example, the LDMOS transistor 10A shown in FIG. 1B. The principal difference between the Schottky diode 100A and Schottky diode 100 is the use of cathode implant region 23A and conductive or insulative plug 33 (FIG. 2B) rather than cathode implant region 23 (FIG. 2A). Also, with respect to the LDMOS transistor 10A, the Schottky diode 100A has a P buffer 21 in the diode region, which is described above in connection with LDMOS transistor 10 and Schottky diode 100, rather than P buffer 39. Use of P buffer 21 is preferred so as to provide charge balance between this region and LDD-2 region 20A, as discussed above.

Figure 4:
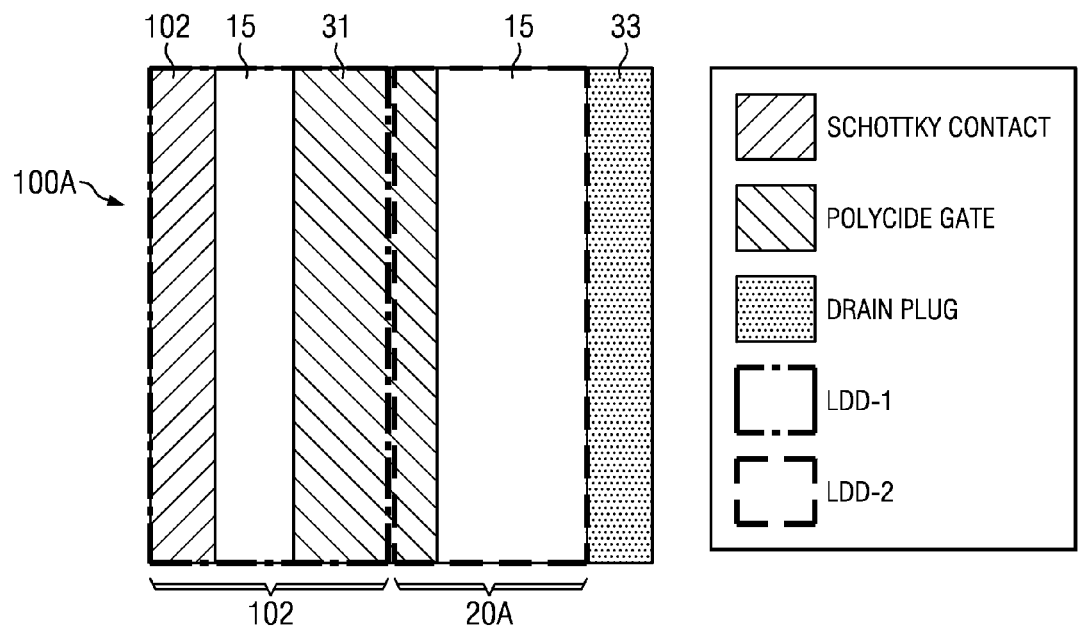
FIG. 4 is a top plan view of the Schottky diode of FIG. 2B taken along lines A-A with dashed lines illustrating various doped regions thereof.
Figure 4A:
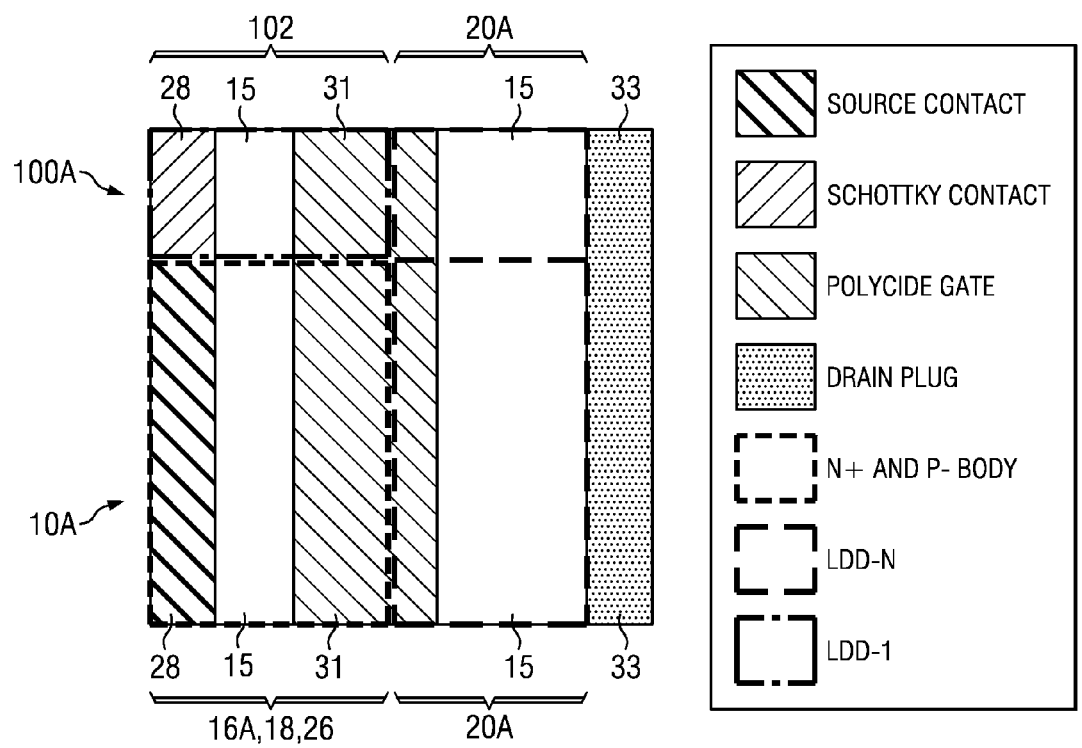
FIG. 4A is a top plan view of the integration of the Schottky diode of FIG. 2B, taken along lines A-A, with the LDMOS transistor of FIG. 1B, taken along lines B-B, with dashed lines illustrating various doped regions thereof.
Figure 4B:
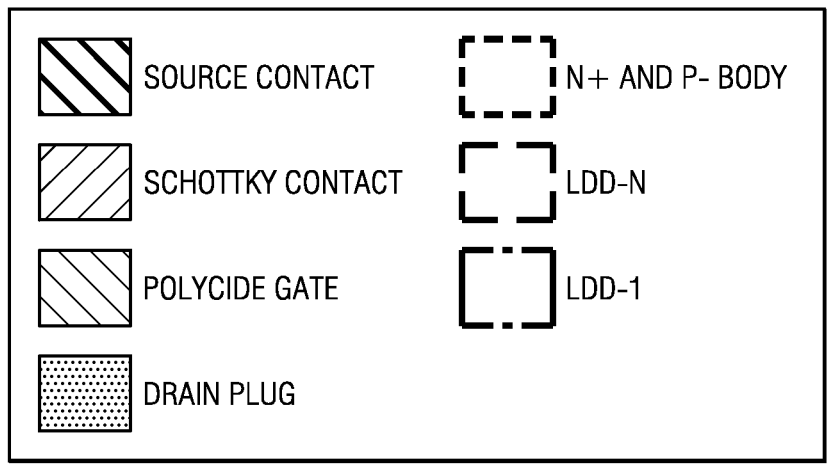
FIG. 4B is an expanded view of the top plan view of FIG. 4A showing the integration of multiple Schottky diodes and LDMOS transistors.
Figure 4B:
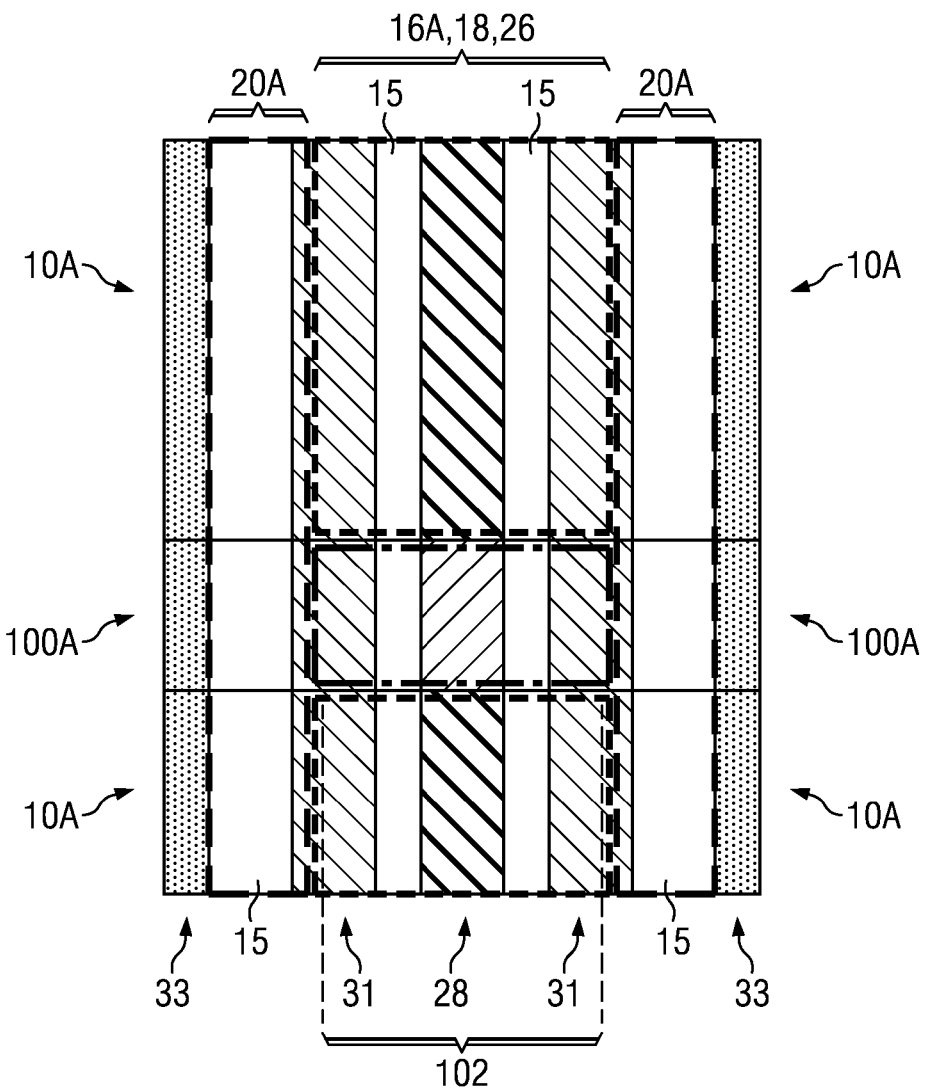

FIG. 4 is a top plan view of the Schottky diode 100A of FIG. 2B taken along lines A-A with dashed lines illustrating various doped regions thereof. FIG. 4A is a top plan view of the integration of the Schottky diode of FIG. 2B, taken along lines A-A, with the LDMOS transistor of FIG. 1B, taken along lines B-B, with dashed lines illustrating the various doped regions of interest in phantom. In one embodiment, this dopant profile can be formed with appropriate masks that are self aligned to the gate 31. As can be seen from FIG. 4A, the Schottky diode 100A can be readily integrated as part of the formation of the LDMOS structure 10A. It can be seen from these figures that the Schottky diode is directly integrated into the structure of the LDMOS device in the depth dimension. Although only one diode and one LDMOS device is shown, a single diode 100A can be disposed between multiple LDMOS devices 10A in the depth dimension as shown in FIG. 4B. It should be understood that multiple LDMOS devices can be arranged side-by-side (such as to share common source contacts and drain plugs) as shown in FIG. 4B or distributed across a die in various other formations while grouped together through metallization structures to function together as active cells, as explained in, for example, the commonly assigned, copending applications discussed above.

When integrated with the LDMOS transistor, the Schottky diode is used to pin or clamp the forward voltage drop on the internal body diode below the injection kink voltage (i.e., the onset of the forward voltage drop at which the diodes starts to inject minority carriers) of about 0.7V. The injection of minority carriers by the body diode is strongly suppressed. By doing so, the stored charge occurring in the body diode under reverse bias conditions is eliminated and the reverse recovery of the diode is minimized. This integration of the Schottky diode with the MOSFET has particular utility when the MOSFET is to be used as a synchronous rectifier with a Schottky contact integrated in each active cell of the transistor.

Figure 3A:
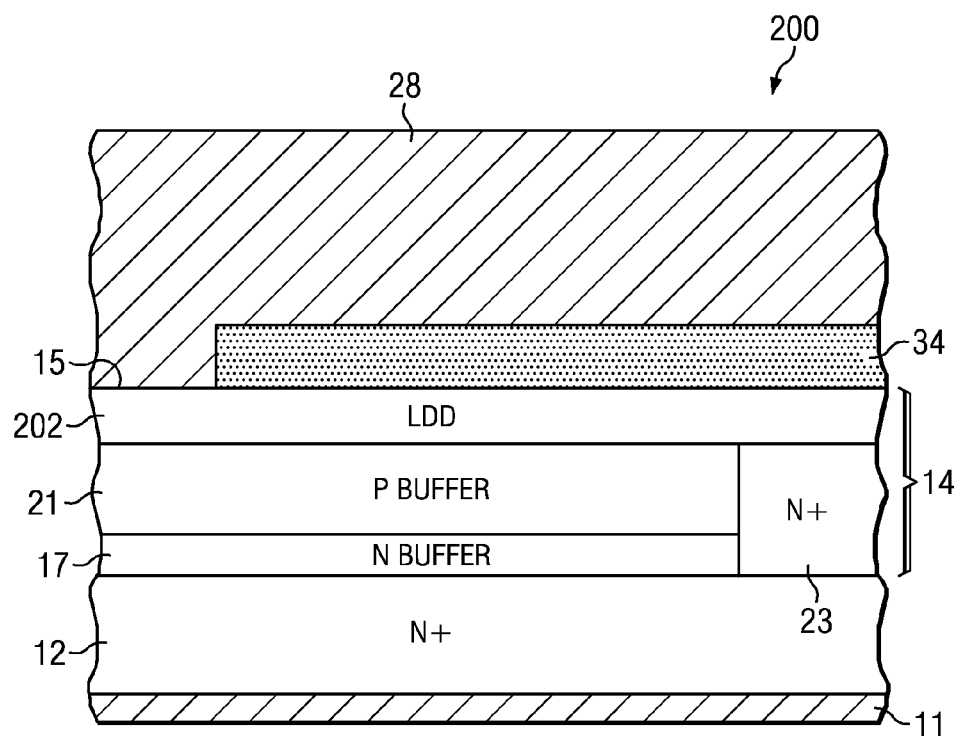
FIGS. 3A and 3B are cross-sectional views of a second embodiment of a Schottky diode for integration with the LDMOS transistors of FIG. 1A and FIG. 1B, respectively.
Figure 3B:
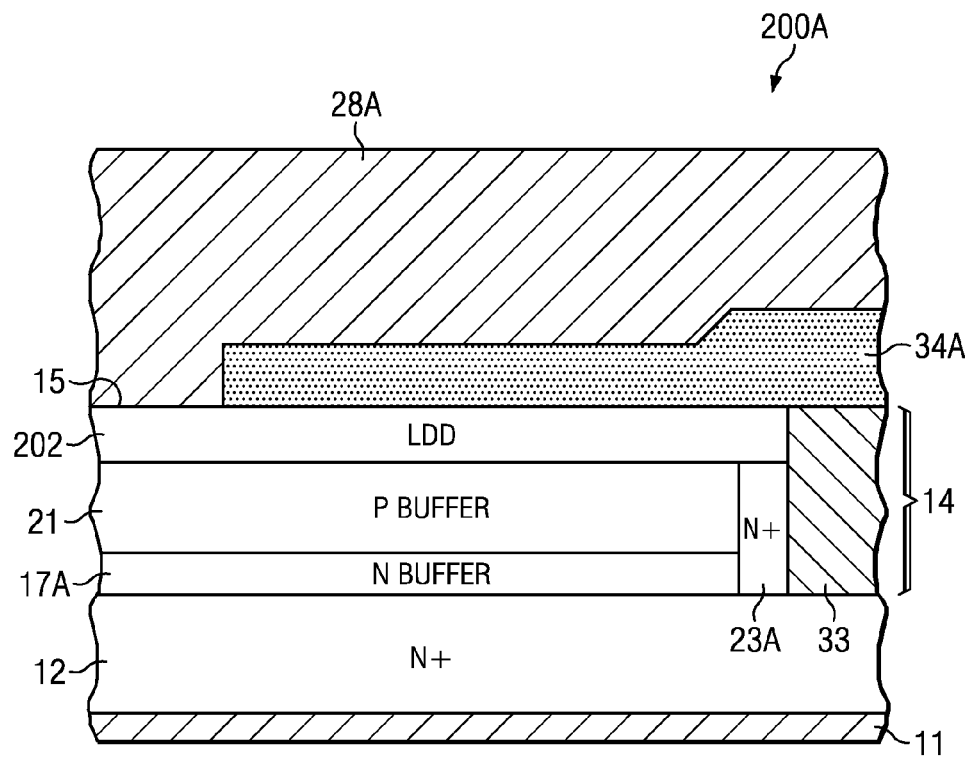

FIGS. 3A and 3B illustrate alternative embodiments of a Schottky diode 200, 200A, respectively, representing further simplifications of the diode structure shown in FIGS. 2A and 2B. In these embodiments, the gate structure is removed in this diode area. As can be seen from FIG. 3A, the Schottky diode 200 includes an n-doped lightly doped implant region 202, metal anode 28 and doped cathode implant plug 23. In some embodiments, region 202 has a doping concentration of about that described above for LDD-1 region 102 of FIGS. 2A and 2B. Insulation layer 34 is disposed between the length of the doped region 202 and the anode 28. Similarly, the Schottky diode 200A includes lightly doped implant region 202, metal anode 28A and doped cathode implant 23A and plug 33. Insulation layer 34A is disposed between the length of the doped region 202 and the anode 28A.

This simplified structure can be integrated with LDMOS transistors 10, 10A, for example, but also is readily adapted for use as a stand alone, discrete Schottky diode by using the same device design principles as used for forming the LDMOS transistors 10, 10A. Because of the small pitch of the structure and a high concentration of dopant atoms in the LDD region 202, the lateral Schottky diode 200, 200A of FIGS. 3A, 3B can have a very low forward voltage drop under conduction. At the same time, the LDD region 202 is depleted under reverse bias conditions and very effectively shields the Schottky contact against high electric field. This assures very good blocking capability of the lateral Schottky diode, even better than in the case of the Trench-MOS Barrier Schottky diode described in the Background of the Invention section. The diode structure is also readily adapted to the charge coupling techniques described above for increasing breakdown voltage by balancing the charge in the P buffer 21 and in the lightly doped region 202.

The performance of the lateral Schottky diodes has been compared in numerical simulations against the Trench-MOS Barrier Schottky diode of the prior art. The original Trench-MOS Barrier Schottky diode (TMBS) reported in the literature had a cell pitch of 1.9 μm and exhibited a forward voltage drop ($V_F$) of about 0.4 V at 100 A/cm$^2$. The TMBS structure used as a reference for this study was simulated at a cell pitch reduced to 0.9 μm achieving a very low forward voltage drop of 0.35 V at 200 A/cm$^2$. To the inventors' knowledge, this is the lowest forward voltage drop of a Schottky diode reported in the literature.

Figure 5:
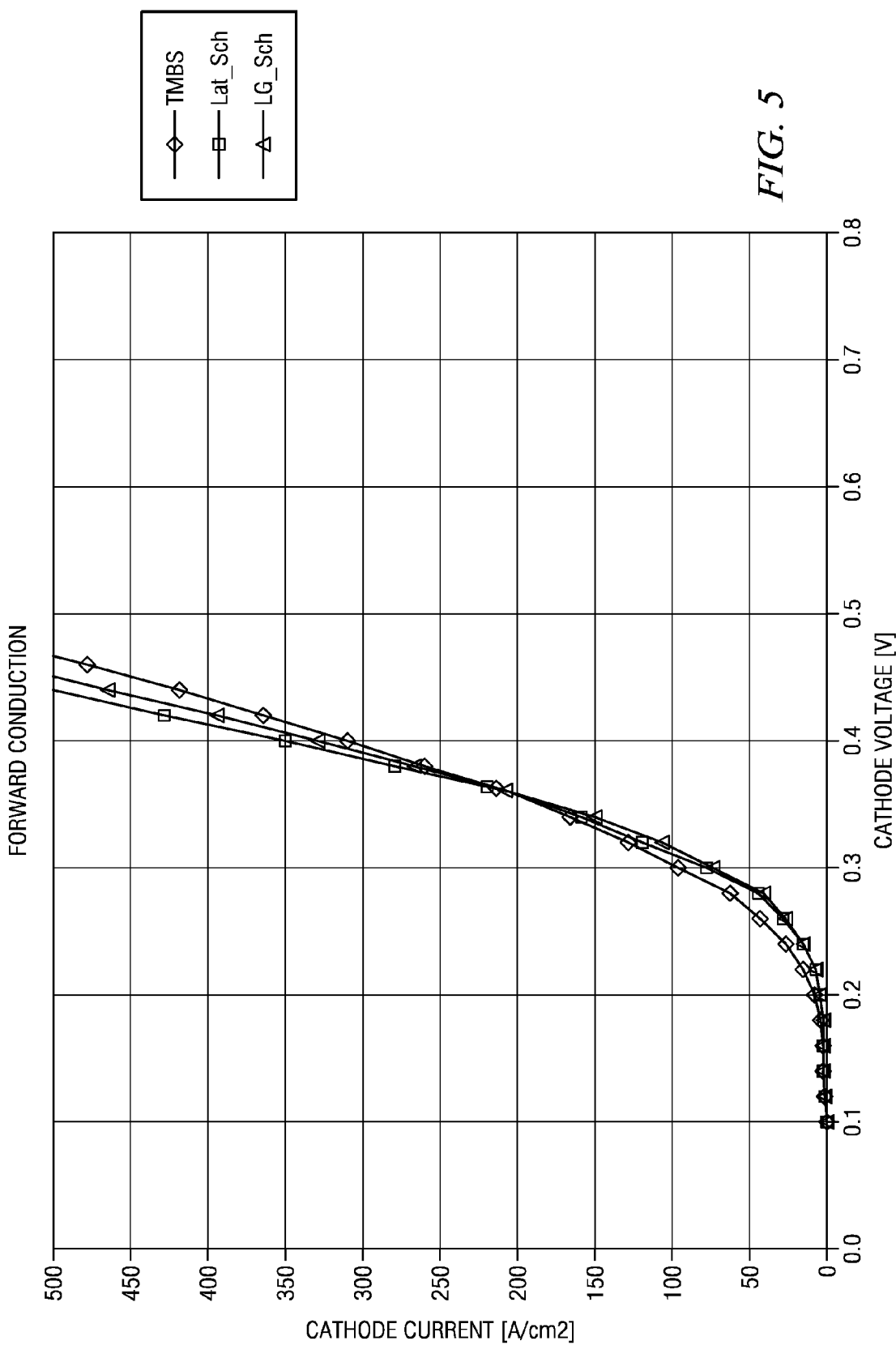
FIG. 5 is a graph comparing the forward conduction capabilities of the laterally gated Schottky diode and lateral Schottky diode designs of the present invention against the TMBS diodes of the prior art.
Figure 6:
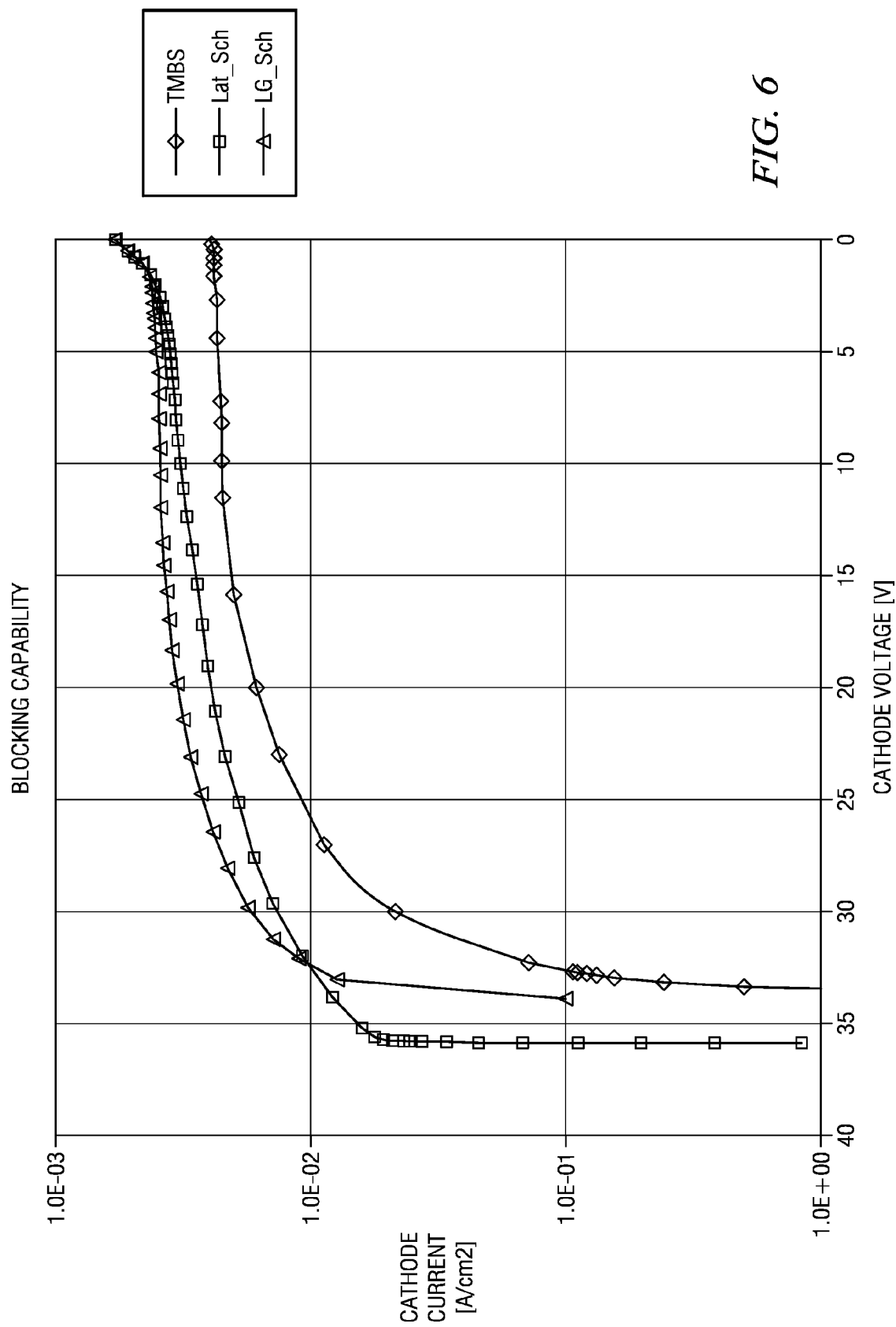
FIG. 6 is a graph comparing the blocking capability of the laterally gated Schottky diode and lateral Schottky diode designs of the present invention against the TMBS diodes of the prior art.

The lateral Schottky diode 200, 200A from FIGS. 3A, 3B and the LG-Schottky diode 100, 100A of FIGS. 2A, 2B can reach the same ultra-low $V_F$ level as the TMBS diode, as shown in FIG. 5. On the other hand, the charge coupling technique applied in the Schottky design allows a high breakdown voltage above 30V with a design pitch of 2.4 μm. As a result, the lateral Schottky diodes with the ultra-low $V_F$ level exhibit much better blocking characteristics than the TMBS diodes. For the same blocking voltage, the Schottky diodes according to the present disclosure have a much lower leakage current, as shown in FIG. 6.

Figure 7:
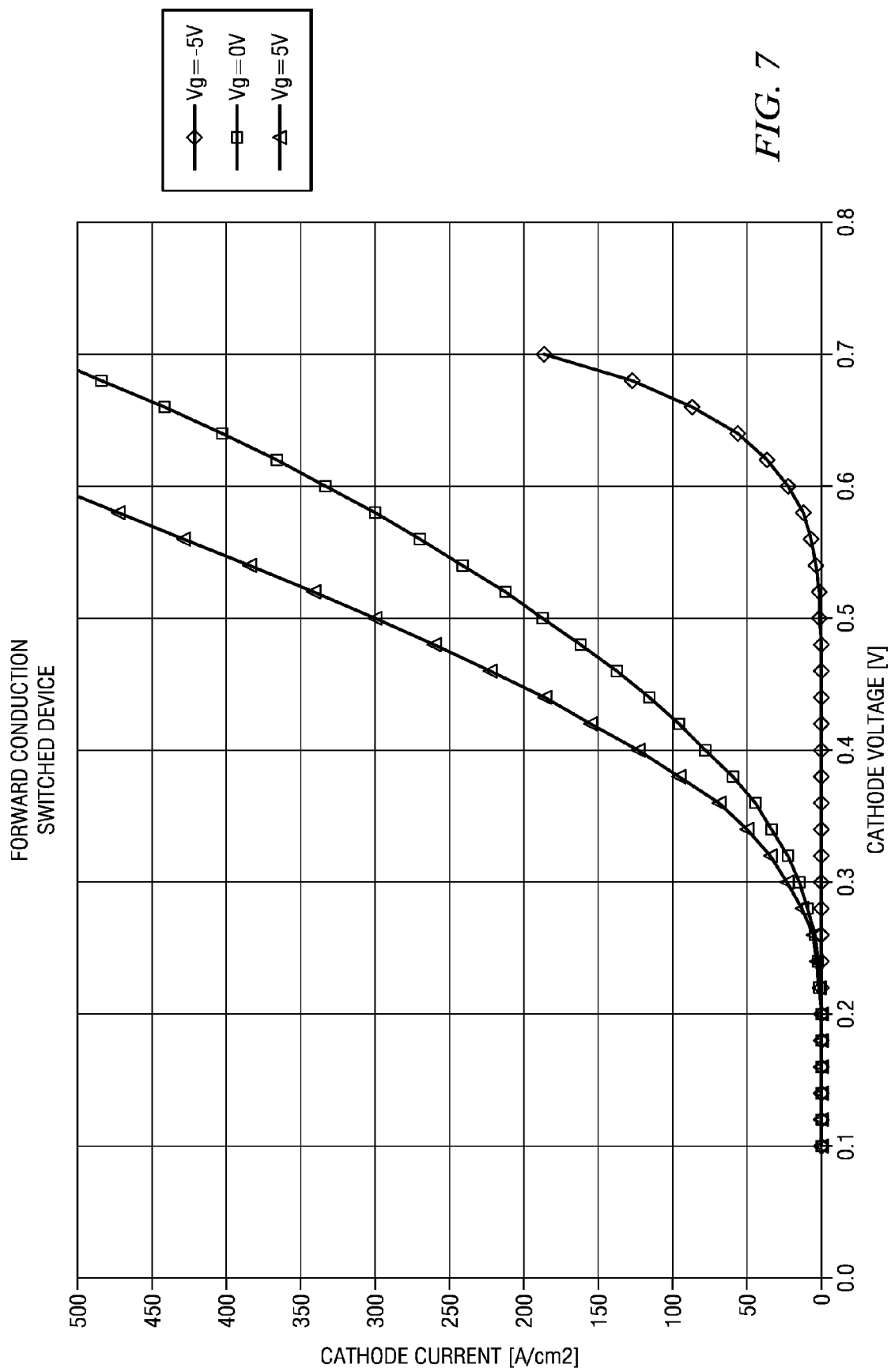
FIG. 7 is a graph showing the cathode current flow for the laterally gated Schottky diodes of the present invention for a range of gate voltages.

Because of the inclusion of gate 31 in the diode region, the LG-Schottky diode 100, 100A from FIGS. 2A, 2B can also be used as a switching device, if desired. When lowering the dopant concentration of the LDD-1 region 102 to about 1×10$^{16}$ atoms/cm$^3$ or below, the LDD-1 region 102 can be depleted by a negative bias applied to the gate 31. The depletion of the LDD-1 region 106 interrupts the current flow from the Schottky contact to the cathode plug region. The current will flow again if the cathode voltage is high enough to lower the barrier induced by the depletion. This behavior is illustrated by simulation results presented in FIG. 7. A sweep of the gate voltage between ±5V can effectively switch the lateral Schottky diode for cathode voltages below 0.5V.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A lateral Schottky diode, comprising:
   a highly doped substrate having a first conductivity type;
   a semiconductor layer formed over the substrate having lower and upper surfaces;
   a lightly doped region of the first conductivity type formed proximate to an upper surface of the semiconductor layer;
   a second doped region comprising dopants of a second conductivity type formed in the semiconductor layer below the lightly doped region;
   an insulator layer formed over the upper surface of the semiconductor layer;
   a conductive anode layer formed over the insulation layer and extending through the insulation layer to form an anode contact providing a Schottky barrier at the upper surface of the semiconductor layer with the lightly doped region; and
   a cathode contact formed in the semiconductor layer between the lightly doped region and the substrate and laterally spaced from the anode contact along the lightly doped region, wherein the lightly doped region comprises a first lightly doped region at the anode contact and a second region of higher concentration doping according to charge balance design with the second doped region of the second conductivity type in the semiconductor layer and the anode layer over the insulator layer.

2. The Schottky diode of claim 1, wherein the cathode contact comprises a highly-doped implant region formed in the semiconductor layer.

3. The Schottky diode of claim 1, further comprising a a buffer region comprising dopants of the first conductivity type formed in the semiconductor layer between the second doped region and the highly doped substrate.

4. The Schottky diode of claim 1, wherein the second doped region abuts the lightly doped region and wherein the lightly doped region and second doped region are doped with dopant profiles to provide charge balance between the second doped region and the lightly doped region.

5. A semiconductor device, comprising:
   a substrate having a first conductivity type;
   a semiconductor layer formed over the substrate and having lower and upper surfaces;
   a laterally diffused metal-oxide-semiconductor (LDMOS) transistor device formed over the substrate and comprising a source region of the first conductivity type and a drain extension region of the first conductivity type formed in the semiconductor layer proximate the upper surface of the semiconductor layer, and a drain contact electrically connecting the drain extension region to the substrate; and
   a lateral Schottky diode formed over the substrate, the diode comprising:
      at least one lightly doped region of the first conductivity type formed in the semiconductor layer proximate to the upper surface;
      second doped region comprising dopants of a second conductivity type formed in the semiconductor layer below the lightly doped region;
      an anode layer over an insulator layer and extending through the insulator layer to form a contact providing a Schottky barrier with the at least one doped region; and
      a cathode contact laterally spaced from the anode contact and electrically connecting the at least one doped region to the substrate, wherein the lightly doped region comprises a first lightly doped region at the anode contact and a second region of higher concentration doing according to charge balance design with the second doped region of the second conductivity type in the semiconductor layer and the anode layer over the insulator layer.

6. The semiconductor device of claim 5, wherein the Schottky diode comprises a first implantation buffer layer formed in the semiconductor layer, the first implantation buffer layer comprising dopants of the first conductivity type, and a second implantation buffer layer formed in the semiconductor layer above the first implantation buffer layer and below the first and second doped regions, the second implantation buffer layer comprising dopants of the second conductivity type.

7. The semiconductor device of claim 6, wherein the second implantation buffer layer extends under the drain extension region, wherein the second implantation buffer layer is doped with a dopant profile with respect to the drain extension region to concentrate avalanche current in the second implantation buffer layer under avalanche breakdown condition.

8. The semiconductor device of claim 6, wherein the second implantation buffer layer extends under the drain extension region, wherein the drain extension region and second implantation buffer layer are doped with dopant profiles to provide charge balance between the implantation buffer layer and the drain extension region.

9. The semiconductor device of claim 8, wherein the second doped region and the drain extension region are part of the same implant region.

10. The semiconductor device of claim 5, wherein the second doped region and the drain extension region are part of the same implant region.

11. The semiconductor device of claim 5, wherein the LDMOS transistor device comprises a body region of a second conductivity type formed in the semiconductor layer, the body region forming a channel region between the source and drain extension regions and extending under the source region, the LDMOS transistor device further comprising:
a trench formed in the semiconductor layer adjacent the source region and extending into the body region; and
a source contact comprising a layer of conductive material deposited in the trench, wherein the source contact provides an electrical short between the source region and the body region.

12. The semiconductor device of claim 11, wherein the LDMOS transistor device comprises a conductive gate formed over the semiconductor layer and an insulating layer formed over the semiconductor layer and conductive gate, wherein the transistor device further comprises a source electrode layer forming the source contact and extending over the insulating layer,
wherein the insulating layer insulates the conductive gate from the source electrode layer,
wherein the insulating layer extends over the first doped region of the Schottky diode, the source electrode layer extending through to form the anode contact.

13. The semiconductor device of claim 11, further comprising a first highly doped region of the second conductivity type formed in the body region below the trench and coupling the body region to the source contact.

14. The semiconductor device of claim 5, wherein the first doped region has a dopant concentration of less than $1 \times 10^{17}$ atoms/cm$^3$.

15. The semiconductor device of claim 5, wherein the first doped region has a doping concentration between about $2 \times 10^{16}$ to about $8 \times 10^{15}$ atoms/cm$^3$.

16. The semiconductor device of claim 5, wherein the drain contact comprises a highly-doped implant region, wherein a topmost portion of the highly-doped implant region is spaced from the upper surface of the semiconductor layer.

17. The semiconductor device of claim 5, wherein the drain contact forms the cathode contact.

18. The semiconductor device of claim 5, wherein the first conductivity type is N conductivity type and the substrate has a highly-doped concentration.

19. The device of claim 5, wherein the drain extension region has a dopant concentration of between about $5 \times 10^{16}$ to about $1 \times 10^{18}$ atoms/cm$^3$.

20. The device of claim 5, wherein the at least one doped region of the Schottky diode comprises one continuous doped region having uniform dopant concentration.

21. The device of claim 20, wherein the Schottky diode further comprises an implantation buffer layer of the second conductivity type formed in the semiconductor layer adjacent to and under the at least one doped region, wherein the at least one doped region and implantation buffer layer are doped with dopant profiles to provide charge balance between the implantation buffer layer and the at least one doped region.

22. A semiconductor device, comprising:
a laterally diffused metal-oxide-semiconductor (LDMOS) transistor device formed over a substrate having a first conductivity type, the substrate having a semiconductor layer formed thereover having lower and upper surfaces, the LDMOS transistor device comprising:
a source region of the first conductivity type and a drain extension region of the first conductivity type formed in the semiconductor layer proximate the upper surface of the semiconductor layer, the source and drain extension regions being spaced from one another;
a body region of a second conductivity type formed in the semiconductor layer, the body region forming a channel region between the source and drain extension regions and extending under the source region;
a conductive gate formed over a gate dielectric layer formed over the channel region;
a drain contact electrically connecting the drain extension region to the substrate and laterally spaced from the channel region, the drain contact comprising a highly-doped drain contact region formed between the substrate and the drain extension region in the semiconductor layer; and
a source metal layer formed over an insulator layer formed over at least a portion of the semiconductor layer and forming a source contact electrically connecting the source region to the body region; and
a lateral Schottky diode formed integrally with the LDMOS transistor, comprising at least one lightly doped region proximate the upper surface of the semiconductor layer adjacent to the source implant region and body region the LDMOS transistor and extending to the drain contact, wherein the source metal layer forms an anode contact providing a Schottky barrier with the at least one lightly doped region at the upper surface of the semiconductor layer, wherein the lightly doped region comprises a first lightly doped region at the anode contact and a second region of higher concentration doping according to charge balance design with the doped region of the second conductivity type in the semiconductor layer and the anode layer over the insulator layer.

23. The semiconductor device of claim 22, wherein the LDMOS device comprises a trench formed in the semiconductor layer, wherein the source contact forms an electrical connection between the source region and the body region in the trench.

* * * * *